(12) United States Patent
Ke

(10) Patent No.: US 11,980,065 B2
(45) Date of Patent: May 7, 2024

(54) DISPLAY PANEL AND DISPLAY DEVICE WITH SYMMETRICALLY ARRANGED STRUCTURES CORRESPONDING TO SAME-COLOR LIGHT-EMITTING UNITS

(71) Applicant: Xiamen Tianma Display Technology Co., Ltd., Xiamen (CN)

(72) Inventor: Zhoulin Ke, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 148 days.

(21) Appl. No.: 17/454,533

(22) Filed: Nov. 11, 2021

(65) Prior Publication Data

US 2023/0072754 A1 Mar. 9, 2023

(30) Foreign Application Priority Data

Sep. 6, 2021 (CN) .......................... 202111040004.9

(51) Int. Cl.
*H10K 59/123* (2023.01)
(52) U.S. Cl.
CPC .................................. *H10K 59/123* (2023.02)
(58) Field of Classification Search
CPC ..................................................... H10K 59/123
USPC .......................................................... 257/40
See application file for complete search history.

(56) References Cited

U.S. PATENT DOCUMENTS

| | | | | |
|---|---|---|---|---|
| 2010/0157399 | A1* | 6/2010 | Kroll | G03H 1/02 359/11 |
| 2019/0393283 | A1* | 12/2019 | Lu | H10K 59/65 |
| 2021/0193762 | A1* | 6/2021 | Yun | H10K 59/35 |
| 2023/0049009 | A1* | 2/2023 | Wu | G06F 1/1656 |

FOREIGN PATENT DOCUMENTS

CN 107819010 A 3/2018

* cited by examiner

*Primary Examiner* — Xia L Cross
(74) *Attorney, Agent, or Firm* — Anova Law Group, PLLC

(57) ABSTRACT

A display panel and a display device are provided in the present disclosure. The display panel includes a base substrate; an array layer, on a side of the base substrate; a plurality of light-emitting units, on a side of the array layer away from the base substrate, where a light-emitting unit of the plurality of light-emitting units includes a first electrode, a light-emitting layer, and a second electrode which are sequentially disposed away from the base substrate; a pixel defining layer, on the side of the array layer away from the base substrate, where the pixel defining layer includes a plurality of pixel openings, the plurality of pixel openings correspond to the plurality of light-emitting units, and a projection of the light-emitting layer on the pixel defining layer is within a pixel opening; and a first metal part between the array layer and the first electrode.

20 Claims, 9 Drawing Sheets

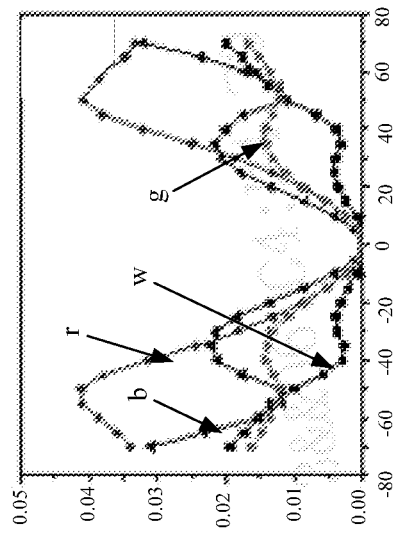
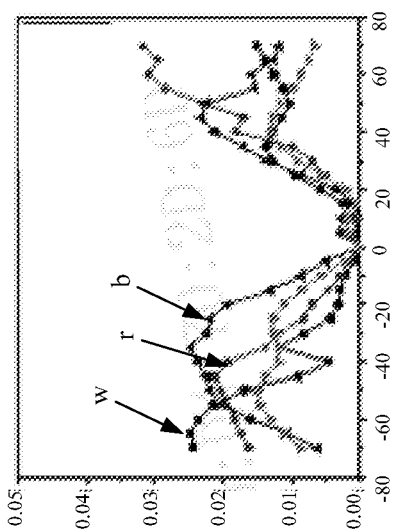
FIG. 8

US 11,980,065 B2

DISPLAY PANEL AND DISPLAY DEVICE WITH SYMMETRICALLY ARRANGED STRUCTURES CORRESPONDING TO SAME-COLOR LIGHT-EMITTING UNITS

CROSS-REFERENCE TO RELATED APPLICATION

This application claims the priority of Chinese Patent Application No. 202111040004.9, filed on Sep. 6, 2021, the content of which is incorporated herein by reference in its entirety.

TECHNICAL FIELD

The present disclosure generally relates to the field of display technology and, more particularly, relates to a display panel and a display device.

BACKGROUND

With continuous advancement of science and technology, more display devices are widely used in people's daily life and work and become an indispensable and important tool. The main component of a display device for realizing display function is a display panel. Currently, OLED (organic light-emitting diode) display panels are mainstream display panels of display devices.

In an existing OLED display panel, due to the layout problem of the metal layer on the side of light-emitting units facing toward the base substrate, the color cast problem of the display panel may occur.

SUMMARY

One aspect of the present disclosure provides a display panel. The display panel includes a base substrate; an array layer, on a side of the base substrate; a plurality of light-emitting units, on a side of the array layer away from the base substrate, where a light-emitting unit of the plurality of light-emitting units includes a first electrode, a light-emitting layer, and a second electrode which are sequentially disposed away from the base substrate; a pixel defining layer, on the side of the array layer away from the base substrate, where the pixel defining layer includes a plurality of pixel openings, the plurality of pixel openings correspond to the plurality of light-emitting units, and a projection of the light-emitting layer on the pixel defining layer is within a pixel opening; and a first metal part, between the array layer and the first electrode. Along a direction perpendicular to the base substrate, an overlapping portion of the first metal part and the pixel opening is a first overlapping portion; along a first direction, within a first preset distance, at least two first overlapping portions corresponding to same-color light-emitting units are arranged according to a first symmetry rule; and the first direction is in parallel with the base substrate.

Another aspect of the present disclosure provides a display device including a display panel. The display panel includes a base substrate; an array layer, on a side of the base substrate; a plurality of light-emitting units, on a side of the array layer away from the base substrate, where a light-emitting unit of the plurality of light-emitting units includes a first electrode, a light-emitting layer, and a second electrode which are sequentially disposed away from the base substrate; a pixel defining layer, on the side of the array layer away from the base substrate, where the pixel defining layer includes a plurality of pixel openings, the plurality of pixel openings correspond to the plurality of light-emitting units, and a projection of the light-emitting layer on the pixel defining layer is within a pixel opening; and a first metal part, between the array layer and the first electrode. Along a direction perpendicular to the base substrate, an overlapping portion of the first metal part and the pixel opening is a first overlapping portion; along a first direction, within a first preset distance, at least two first overlapping portions corresponding to same-color light-emitting units are arranged according to a first symmetry rule; and the first direction is in parallel with the base substrate.

Other aspects of the present disclosure can be understood by those skilled in the art in light of the description, the claims, and the drawings of the present disclosure.

BRIEF DESCRIPTION OF THE DRAWINGS

In order to more clearly explain various embodiments of the present disclosure, the drawings required for describing various embodiments or the existing technology are briefly introduced hereinafter. Obviously, the drawings in the following description are merely some embodiments of the present disclosure. Other drawings may also be obtained by those skilled in the art without any creative work according to provided drawings.

The structures, proportions, sizes, and the like shown in the drawings of the specification are merely used to match the content disclosed in the specification for the understanding and reading of those familiar with the technology and are not used to limit the implementation conditions of the present disclosure. Therefore, the structures, proportions, sizes, and the like may have no technical significance. Any structural modification, proportional relationship change, or size adjustment should still fall within the scope of the technical content disclosed in the present disclosure without affecting the effects and objectives that can be achieved by the present disclosure.

FIG. 8 illustrates graphs of viewing angle and chromaticity according to various embodiments of the present disclosure.

DETAILED DESCRIPTION

Various embodiments of the present disclosure are described clearly and completely in conjunction with the drawings in various embodiments of the present disclosure. Obviously, described embodiments are only a part of various embodiments of the present disclosure, rather than all embodiments. Based on various embodiments in the present disclosure, all other embodiments obtained by those skilled in the art without creative work shall fall within the protection scope of the present disclosure.

An OLED display panel may include a base substrate; an array layer located on one side of the base substrate, where the array layer has connected pixel circuits; a plurality of light-emitting units on the side of the array layer away from the base substrate, where the light-emitting unit has a first electrode, a light-emitting layer, and a second electrode which are sequentially away from the base substrate; and a pixel defining layer located on the side of the array layer away from the base substrate, where the pixel defining layer includes a plurality of pixel openings, the pixel openings correspond to the light-emitting units, and the projection of the light-emitting layer on the pixel defining layer is located within the pixel opening. The first electrode needs to be connected to the pixel circuit through the first metal part. The pixel defining layer is located on the side of the array layer away from the base substrate, the pixel defining layer includes a plurality of pixel openings, the pixel openings correspond to the light-emitting units, and the projection of the light-emitting layer on the pixel defining layer is in the pixel opening.

In the conventional layout, the first overlapping portions are arranged irregularly, which causes uneven height fluctuation of the first electrodes of the light-emitting units and results in the display color cast problem, thereby affecting the display quality of the display panel.

In order to solve the above-mentioned problem, various embodiments of the present disclosure provide a display panel. Along the first direction, within the first preset distance, at least two first overlapping portions corresponding to same-color light-emitting units may be arranged according to the first symmetry rule. Therefore, the first electrodes of same-color light-emitting units may have desirable symmetry, and the symmetrical fluctuation of the first electrodes may eliminate the display color cast problem and improve the display quality.

In order to clearly understand the above-mentioned objectives, features and advantages of the present disclosure, the present disclosure is further described below with reference to the accompanying drawings and embodiments.

Figure 1:
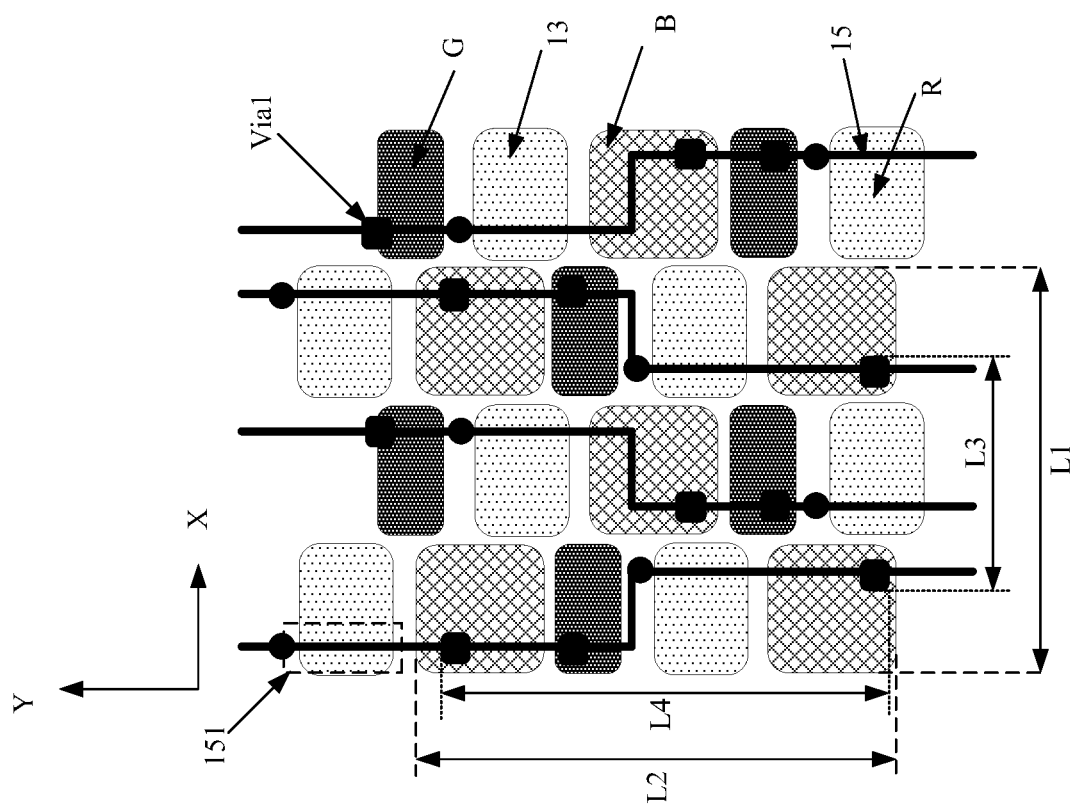
FIG. 1 illustrates a top view of light-emitting units and metal parts in a display panel according to various embodiments of the present disclosure.
Figure 2:
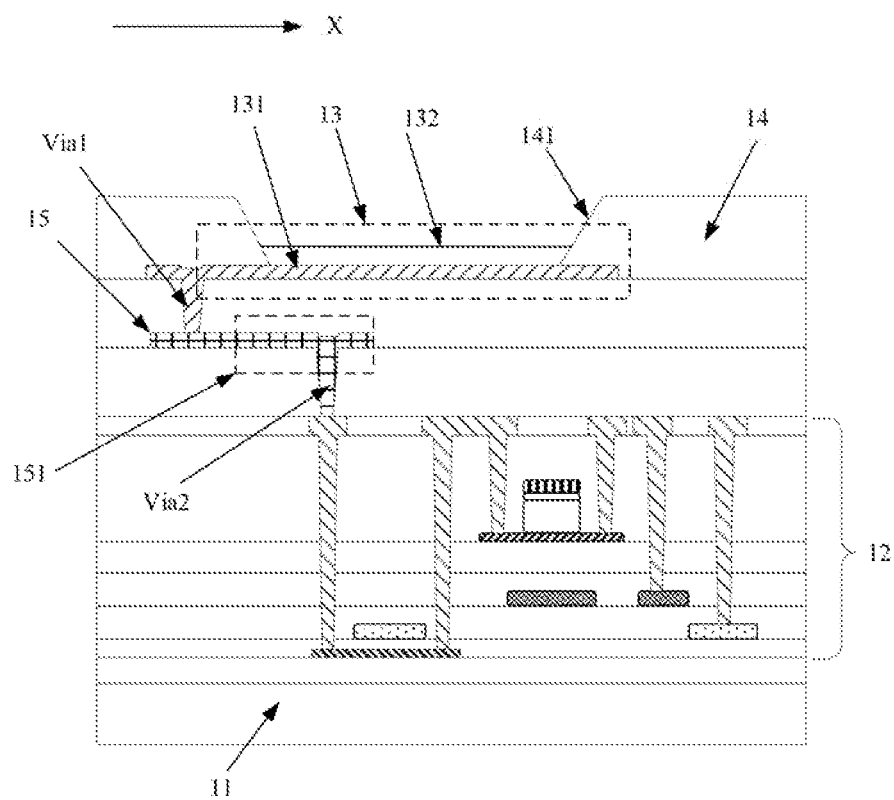
FIG. 2 illustrates a cross-sectional view of a display panel according to various embodiments of the present disclosure.

Referring to FIGS. 1-2, FIG. 1 illustrates a top view of light-emitting units and metal parts in a display panel according to various embodiments of the present disclosure; and FIG. 2 illustrates a cross-sectional view of a display panel according to various embodiments of the present disclosure.

The display panel may include a base substrate 11; an array layer 12 located on a side of the base substrate 11; a plurality of light-emitting units 13 located on a side of the array layer 12 away from the base substrate 11, where the light-emitting unit 13 may include a first electrode 131, a light-emitting layer 132, and a second electrode (not shown in FIGS. 1-2) which are sequentially disposed away from the base substrate; a pixel defining layer 14 located on the side of the array layer 12 away from the base substrate 11, where the pixel defining layer 14 may include a plurality of pixel openings 141, the pixel openings 141 may correspond to the light-emitting units 13, and the projection of the light-emitting layer 132 on the pixel defining layer 14 may be located in the pixel opening 141; and the first metal part 15 located between the array layer 12 and the first electrode 131.

Along the direction perpendicular to the base substrate 11, the overlapping portion of the first metal part 15 and the pixel opening 141 may be the first overlapping portion 151. Along the first direction X, within the first preset distance L1, at least two first overlapping portions 151 corresponding to same-color light-emitting units 13 may be arranged according to the first symmetry rule, and the first direction X may be in parallel with the base substrate 11.

Along the first direction X, within the first preset distance L1, the first light-emitting unit and the second light-emitting unit may be configured as two same-color light-emitting units 13 that satisfy the first symmetry rule. Both the first light-emitting unit and the second light-emitting unit may have the display color cast problem due to the corresponding first overlapping portions 151. The first overlapping portion 151 of the first light-emitting unit and the first overlapping portion 151 of the second light-emitting unit satisfy the first symmetry rule, such that the color cast of the first light-emitting unit and the second light-emitting unit may be compensated and cancelled with each other. Therefore, in various embodiments of the present disclosure, along the first direction X, within the first preset distance L1, the first overlapping portions 151 corresponding to two same-color light-emitting units 13 may be arranged according to the first symmetry rule, which may solve the color cast problem of two same-color light-emitting units 13 along the first direction X due to the irregular arrangement of the first overlapping portions 151.

Along the first direction X, within the first preset distance L1, if the first overlapping portions 151 corresponding to two same-color light-emitting units 13 satisfy the first symmetry rule, the color cast problem of two same-color light-emitting units 13 within the first preset distance L1 may be solved. The first preset distance L1 may be set based on requirements. Obviously, in the display panel, along the first direction X, the more the first overlapping portions 151 that satisfy the first symmetry rule are, the better the effect of compensating the color cast through the first symmetry rule is, the less obvious the display color cast is, and the more desirable the display effect is.

The first direction X may be set based on requirements. Optionally, when the light-emitting units 13 are arranged in an array, if the first direction X is the row direction of the array, the color cast problem in the row direction may be solved at this point; and if the first direction X is the column direction of the array, the color cast problem in the column direction may be solved at this point. In other embodiments, the first direction X may also be another direction that intersects the row direction and is not perpendicular with the row direction. The first direction X may not be limited according to various embodiments of the present disclosure.

Along the first direction X, within the first preset distance L1, at least two first overlapping portions 151 corresponding to same-color light-emitting units 13 may be arranged according to the first symmetry rule, which includes that at least one first symmetrical structure may be included in the plurality of light-emitting units 13 arranged along the first direction X, the first symmetrical structure may include two light-emitting units 13, and the first overlapping portions 151 corresponding to the two light-emitting units 13 may satisfy the first symmetry rule; and/or, at least one second symmetrical structure may be included in the plurality of light-emitting units 13 arranged along the first direction X, the second symmetrical structure may have 2N light-emitting units 13, and N may be a positive integer greater than 1. In a same second symmetrical structure, the first overlapping portions 151 corresponding to the N light-emitting units 13 as a whole may satisfy the first symmetry rule with the first overlapping portions 151 corresponding to other N light-emitting units 13 as a whole.

Along the first direction X, within the first preset distance L1, if the first overlapping portions 151 corresponding to two light-emitting units 13 satisfy the first symmetry rule, two first overlapping portions 151 corresponding to the two light-emitting units 13 may be axially symmetrical, and the symmetry axis may be the symmetry axis of the two light-emitting units 13; and/or the two light-emitting units 13 may be centrally symmetrical, and the symmetry center may be the symmetry center of the two light-emitting units 13.

Four rows of light-emitting units are shown in FIG. 1 in one embodiment, and each row of light-emitting units may correspond to one first metal part 15. The four rows of light-emitting units may be set to be the first row of light-emitting units to the fourth row of light-emitting units along the first direction X. The light-emitting units 13 in the first column and the third column of a same row may have a same light-emitting color, and the light-emitting units 13 in the second column and the fourth column of a same row may have a same light-emitting color. At this point, the first preset distance L1 may be the width occupied by three consecutive adjacent rows of light-emitting units along the first direction X.

The first overlapping portion 151 corresponding to any light-emitting unit 13 in the first column and the first overlapping portion 151 corresponding to a same-row light-emitting unit 13 in the third column may satisfy axial symmetry, that is, two adjacent same-color light-emitting units 13 along the first direction X may satisfy the first symmetry rule. The first overlapping portion 151 corresponding to any light-emitting unit 13 in the second column and the first overlapping portion 151 corresponding to a same-row light-emitting unit 13 in the fourth column may satisfy axial symmetry, that is, two adjacent same-color light-emitting units 13 along the first direction X may satisfy the first symmetry rule.

In various embodiments of the present disclosure, along the second direction Y, within the second preset distance L2, at least two first overlapping portions 151 corresponding to same-color light-emitting units 13 may be arranged according to the second symmetry rule, and the second direction Y may be in parallel with the base substrate 11 and perpendicular to the first direction X. The second symmetry rule may be same as or different from the first symmetry rule. That is, the first symmetry rule and the second symmetry rule may both be axially symmetrical, or both be centrally symmetrical; or one may be axially symmetrical, and another may be centrally symmetrical.

Along the second direction Y, within the second preset distance L2, the first overlapping portions 151 corresponding to the third light-emitting unit and the fourth light-emitting unit may be set to satisfy the second symmetry rule, and both the third light-emitting unit and the fourth light-emitting unit may have the display color cast problem due to the corresponding first overlapping portions 151. The first overlapping portion 151 of the third light-emitting unit and the first overlapping portion 151 of the fourth light-emitting unit may satisfy the second symmetry rule, such that the color cast of the third light-emitting unit and the fourth light-emitting unit may be compensated and cancelled with each other. Therefore, in various embodiments of the present disclosure, along the second direction Y, within the second preset distance L2, the first overlapping portions 151 corresponding to two same-color light-emitting units 13 may be arranged according to the second symmetry rule, which may solve the color cast problem, along the second direction X, of two same-color light-emitting units 13 due to irregular arrangement of the first overlapping portions 151. In one embodiment illustrated in FIG. 1, the second preset distance L2 may be the length occupied by four consecutively arranged light-emitting units 13 along the column direction in a same column.

Along the second direction Y, within the second preset distance L2, if the first overlapping portions 151 corresponding to two same-color light-emitting units 13 satisfy the first symmetry rule, the color cast problem of two same-color light-emitting units 13 within the second preset distance L2 may be solved. The second preset distance L2 may be set based on requirements. Similarly, along the second direction Y, the more the first overlapping portions 151 that satisfy the second symmetry rule are, the better the effect of compensating the color cast through the second symmetry rule is, the less obvious the display color cast is, and the better the display effect is.

The second direction Y may be perpendicular to the first direction X, and the second direction Y may be determined according to the first direction. When the first direction X is the row direction of the array, the second direction Y is the column direction of the array; and when the first direction X is the column direction of the array, the second direction Y is the row direction of the array. When the first direction X is another direction that intersects the row direction and is not perpendicular to the row direction, the second direction Y may be determined based on vertical relationship. When the layout of the light-emitting units 13 in the display panel is fixed, the first direction X and the second direction Y may be set by arranging the extending direction of the first metal part 15.

Along the second direction Y, within the second preset distance L2, at least two first overlapping portions 151 corresponding to same-color light-emitting units 13 may be arranged based on the second symmetry rule, which includes that at least one third symmetrical structure may be included in the plurality of light-emitting units 13 arranged along the second direction Y, the third symmetrical structure may include two light-emitting units 13, and the first overlapping portions 151 corresponding to the two light-emitting units 13 may satisfy the second symmetry rule; and/or at least one fourth symmetrical structure may be included in the plurality of light-emitting units 13 arranged along the second direction Y, the fourth symmetrical structure may have 2M light-emitting units 13, and M may be a positive integer greater than 1. In a same fourth symmetrical structure, the first overlapping portions 151 corresponding to M light-emitting units 13 as a whole may satisfy the second symmetry rule with respect to the first overlapping portions 151 corresponding to other M light-emitting units 13.

Along the second direction Y, within the second preset distance L2, if the first overlapping portions 151 corresponding to two light-emitting units 13 satisfy the second symmetry rule, two first overlapping portions 151 corresponding to the two light-emitting units 13 may be axially symmetrical, or the two light-emitting units 13 may be centrally symmetrical. As shown in FIG. 1 in one embodiment, the center of the first overlapping portions 151 of the two light-emitting units 13 may be used as an example to illustrate the second symmetry rule.

For example, as shown in FIG. 1 in one embodiment, in any column of light-emitting units, the first overlapping portions 151 corresponding to two adjacent same-color light-emitting units 13 along the second direction Y may satisfy the central symmetry, that is, two adjacent same-color light-emitting units 13 along the second direction Y may satisfy the second symmetry rule. For example, along the second direction Y, in the first column, the first overlapping portion 151 corresponding to the first red light-emitting unit R and the first overlapping portion 151 corresponding to adjacent second red light-emitting unit 151 may be centrally symmetrical; and the first overlapping portion 151 corresponding to the first blue light-emitting unit B and the first overlapping portion 151 corresponding to adjacent second blue light-emitting unit B may be centrally symmetrical.

As shown in FIG. 1, the first direction X may be set as the row arrangement direction of the light-emitting units 13 in the display panel, and the second preset distance L2 may be greater than or equal to the first preset distance L1. Setting the second preset distance L2 to be greater than or equal to the first preset distance L1 may make the symmetry degree along the first direction X not weaker than the symmetry degree along the second direction Y.

The first metal part 15 may be used to connect the first electrode 131 of the light-emitting unit 13 with the transistor in the pixel circuit. In the display panel, the first metal part 15 may be mainly wired along the column direction of the light-emitting units 13. When the first direction X is the row arrangement direction of the light-emitting units 13, the symmetry degree of the first overlapping portions 151 along the first direction X may need to be stronger than the symmetry degree of the first overlapping portions 151 along the second direction, which may be beneficial for obtaining desirable color cast compensation effect and achieving better image display quality.

As shown in FIGS. 1-2, the first metal part 15 may be connected to the first electrode 131 through the first via Via1; and along the direction perpendicular to the base substrate 11, the first via Via1 and the pixel opening 141 may not be overlapped with each other. Along the direction perpendicular to the base substrate 11, the first via Via1 and the pixel opening 141 may be configured to be not overlapped with each other, such that the unevenness problem of local protrusion of the first electrode 131 in the pixel opening 141 caused by the first via Via1 when the first via Via1 and the pixel opening 141 are overlapped with each other may be avoided, thereby avoiding the color cast problem due to the overlapping of the first via Via1 and the pixel opening 141.

As shown in FIG. 1 in one embodiment, a part of the first vias Via1 may not overlap the corresponding pixel openings 141, which is shown by the circular first vias Via1; and another part of the first vias Via1 may overlap the corresponding pixel openings 141, which is shown by the rectangular first vias Via1. The circular and rectangular first vias Via1 in FIG. 1 may only be used to indicate whether the first vias Via1 overlap the pixel openings 141. The shapes of the first vias Via1 may be rectangular, circular, triangular, or any other suitable geometric shapes.

Along the direction perpendicular to the base substrate 11, at least a part of the first vias Via1 connected to the first electrodes 131 may be configured to be not overlapped with the corresponding pixel openings 141, such that the unevenness problem of local protrusions of the first electrodes due to the overlapping of the first vias Via1 and the pixel openings 141 may be avoided. Optionally, all of the first vias Via1 connected to the first electrodes 131 may be configured to be not overlapped with the corresponding pixel openings 141.

A plurality of columns of light-emitting units 13 arranged sequentially and a plurality of rows of light-emitting units 13 arranged sequentially may be configured in the display panel. The row direction may be perpendicular to the column direction. The display panel may include red light-emitting units R, green light-emitting units G, and blue light-emitting units B.

As shown in FIG. 1 in one embodiment, any three consecutively arranged light-emitting units 13 in a same column may be configured to have different light-emitting colors. In a same row, all the light-emitting units 13 may have a same light-emitting color. Along the second direction Y, the light-emitting colors of the light-emitting units 13 in any three consecutive rows may be different. For three consecutive rows along the second direction, the light-emitting units 13 in the third row may have an overlapping portion with each of the light-emitting units 13 in the first and second rows along the first direction X. In one embodiment, the light-emitting units 13 in odd-numbered columns may be located in odd-numbered rows, and the light-emitting units 13 in even-numbered columns may be located in even-numbered rows. For example, the first red light-emitting unit R in the first column may be located in the first row, and the first blue light-emitting unit B may be located in the third row; and the first green light-emitting unit G in the second column may be located in the second row, and the first red light-emitting unit R may be located in the fourth row. In other embodiments, the light-emitting units 13 in odd-numbered columns may be located in even-numbered rows, and the light-emitting units 13 in even-numbered columns may be located in odd-numbered rows.

In the display panel, the arrangement of the light-emitting units 13 may not be limited to the arrangement shown in FIG. 1, and the arrangement of the light-emitting units 13 may be configured based on requirements.

Figure 3:
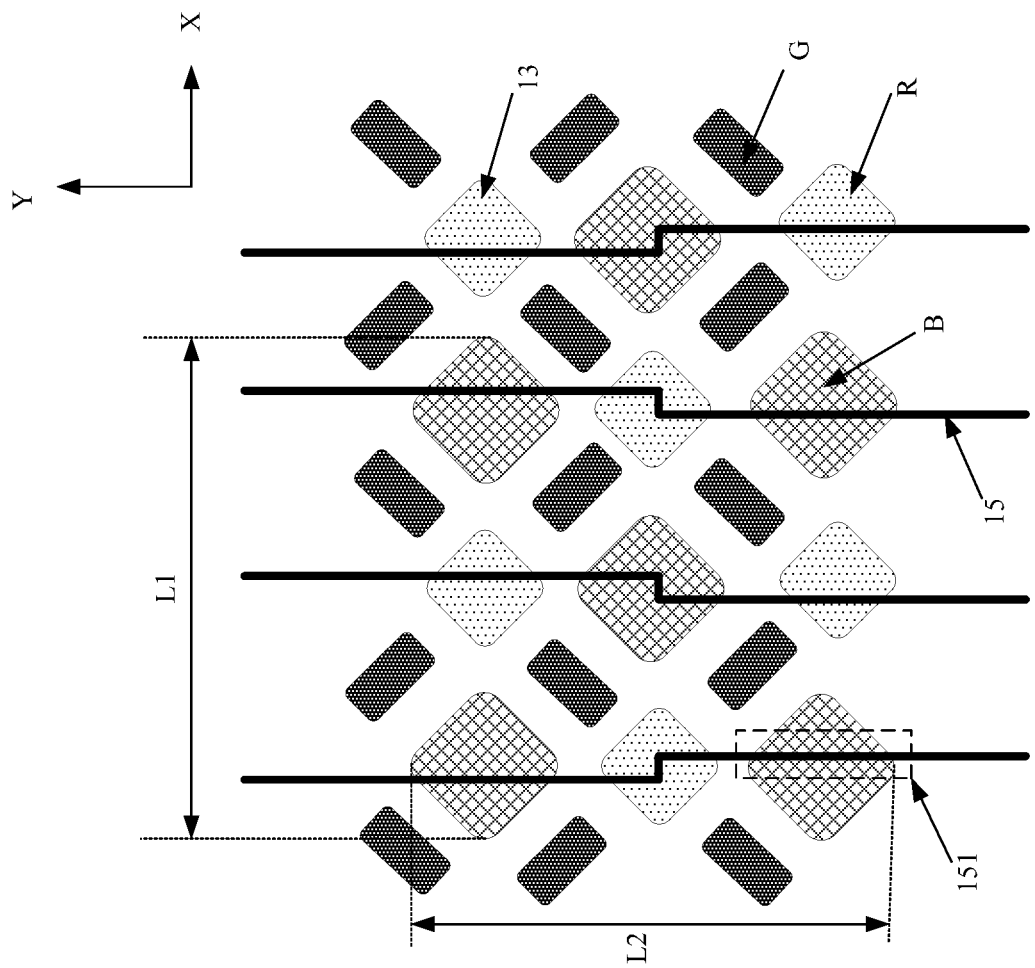
FIG. 3 illustrates another top view of light-emitting units and metal parts in a display panel according to various embodiments of the present disclosure.

As shown in FIG. 3, FIG. 3 illustrates another top view of light-emitting units and metal parts in a display panel according to various embodiments of the present disclosure. In one embodiment, in any two adjacent columns, the light-emitting units 13 in a row may all be green light-emitting units G, and the other column may include a plurality of red light-emitting units R and blue light-emitting units B arranged alternately along the column direction; in any two adjacent rows, the light-emitting units 13 in one row may all be green light-emitting units G, and the other row may include a plurality of red light-emitting units R and blue light-emitting units B alternately arranged along the row direction; and a red light-emitting unit R or a blue light-emitting unit B may be configured among four green light-emitting units G arranged in 2×2. In one embodiment, the first metal parts 15 corresponding to the entire row of green light-emitting units may not be shown; and the first vias Via1 connecting the first metal parts 151 with the first electrodes 131 may not be shown.

Figure 4:
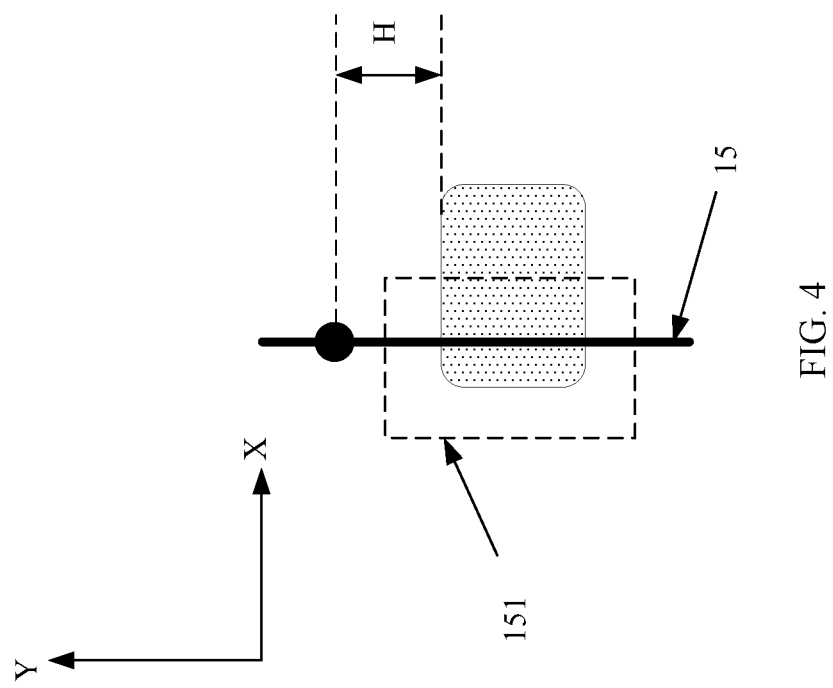
FIG. 4 illustrates an enlarged layout view of a light-emitting unit and a first via according to various embodiments of the present disclosure.

As shown in FIG. 4, FIG. 4 illustrates an enlarged layout view of a light-emitting unit and a first via according to various embodiments of the present disclosure. Referring to FIGS. 1, 2, and 4, along the second direction Y, the distance H between the first via Via1 and the pixel opening 141 may be set to be greater than 1.5 μm. When the distance H between the first via Via1 and the pixel opening 141 is greater than 1.5 μm, along the second direction Y, the first via Via1 and the pixel opening 141 may have a relatively large distance, which may better avoid the unevenness problem of local protrusion of the first electrode 131 in the pixel opening 141 due to relatively close distance or even overlapping between the first via Via1 and the pixel opening 141, thereby avoiding the caused color cast problem.

Figure 5:
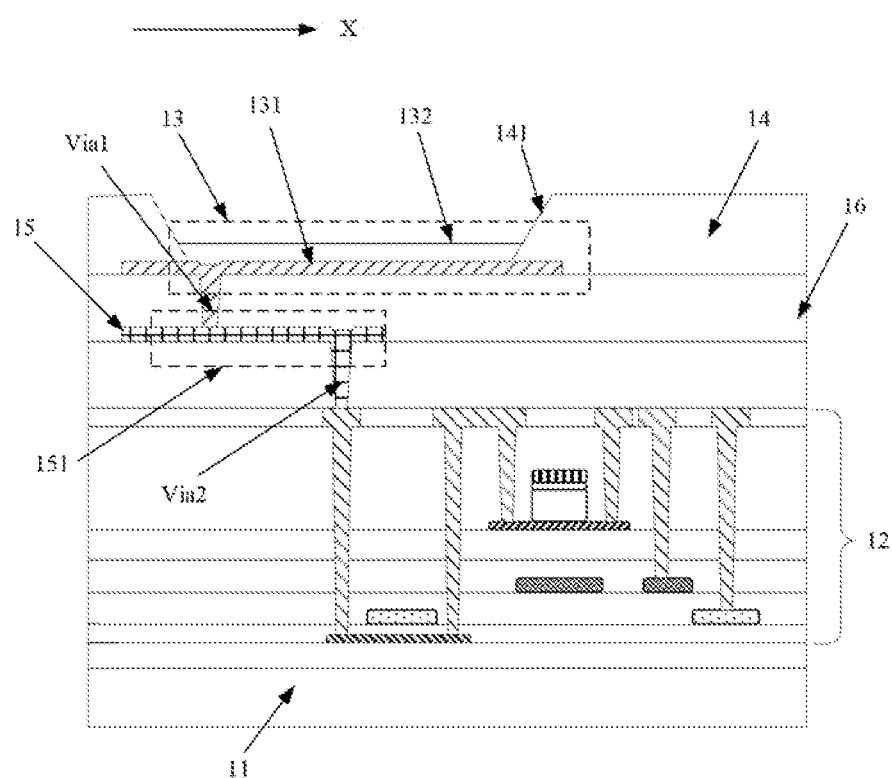
FIG. 5 illustrates another cross-sectional view of a display panel according to various embodiments of the present disclosure.

As shown in FIG. 5, FIG. 5 illustrates another cross-sectional view of a display panel according to various embodiments of the present disclosure. Referring to FIGS. 1 and 5, the first metal part 15 may be connected to the first electrode 131 through the first via Via1. As shown in FIG. 5 in one embodiment, along the direction perpendicular to the base substrate 11, the first via Via1 may overlap the pixel opening 141; and along the first direction X, within the third preset distance L3, at least two first vias Via1 corresponding to same-color light-emitting units 13 may be arranged according to the first symmetry rule. If the first via Via1 overlaps the corresponding pixel opening 141, the vertical projection of the first via Via1 on the base substrate 11 may be at least partially located within the vertical projection of the pixel opening 141 on the base substrate 11.

Along the first direction X, within the third preset distance L3, the first vias Via1 connected to the fifth light-emitting unit and the sixth light-emitting unit of a same color may be arranged according to the first symmetry rule. The flatness of the first electrode 131 of the fifth light-emitting unit may be poor due to the connected first via Via1, thereby causing color cast. Similarly, the sixth light-emitting unit may also have color cast due to the poor flatness of the first electrode 131. The first vias Via1 connected to the fifth light-emitting unit and the sixth light-emitting unit satisfy the first symmetry rule, such that the color cast of the fifth light-emitting unit and the sixth light-emitting unit may be compensated and cancelled with each other. Therefore, in various embodiments of the present disclosure, along the first direction X, within the third preset distance L3, the first vias Via1 corresponding to two same-color light-emitting units 13 may be arranged according to the first symmetry rule, which may solve the color cast problem, along the first direction X, of two same-color light-emitting units 13 due to the overlapping of the first vias Via1 with the corresponding pixel openings 141.

In one embodiment, a part of the first vias Via1 connected to the light-emitting units 13 may be shown in FIG. 1. The first vias Via1 of two green light-emitting units G in the second row may satisfy the first symmetry rule. For example, the two first vias Via1 may be axially symmetrical about the perpendicular bisector of the line connecting the midpoints of the two green light-emitting units G, and may be centrally symmetrical about the midpoint of the line connecting the centers of the two green light-emitting units G. The first vias Via1 of two blue light-emitting units B in the third row may satisfy the first symmetry rule. For example, the two first vias Via1 may be axially symmetrical about the perpendicular bisector of the line connecting the midpoints of the two blue light-emitting units B, and may be centrally symmetrical about the midpoint of the line connecting the centers of the two blue light-emitting units B. Other first vias Via1 not shown may not be overlapped with the corresponding pixel openings 141 or may be overlapped with the corresponding pixel openings 141 and arranged according to the above-mentioned first symmetry rule.

Since the first vias Via1 connected to the first electrodes 131 directly affect the flatness of the first electrodes, the symmetry requirement of the first vias Via1 along the row direction may be higher than the symmetry requirement of the first metal parts 15 along the row direction. A planarization layer 16 may be between the first metal part 15 and the first electrode 131, and the first via Via1 may be directly connected to the first electrode 131, such that the influence of the first via Via1 on the flatness of the first electrode 131 may be stronger than the influence of the first metal part on the flatness of the first electrode 131. Therefore, when the first direction X is the row direction of the light-emitting units 13 in the display panel, the third preset distance L3 may be set to be less than or equal to the first preset distance L1, such that the symmetry degree of the first via Via1 along the row direction may be not weaker than the symmetry degree of the first metal part 15 along the row direction, thereby better solving the display color cast problem.

In one embodiment of the present disclosure, the first metal part 15 may be connected to the first electrode 131 through the first via Via1. Along the direction perpendicular to the base substrate 11, if the first via Via1 overlaps the pixel opening 141, along the first direction X, within the third preset distance L3, at least two first vias Via1 corresponding to same-color light-emitting units 13 may be arranged according to the first symmetry rule; and/or, along the second direction Y, within the fourth preset distance L4, at least two first vias Via1 corresponding to same-color light-emitting units 13 may be arranged according to the second symmetry rule, and the second direction Y may be in parallel with the base substrate and perpendicular to the first direction X.

As disclosure above, when along the first direction X, within the third preset distance L3, at least two first vias Via1 corresponding to same-color light-emitting units 13 may be arranged according to the first symmetry rule, which may solve the color cast problem due to the overlapping of the first vias Via1 and the pixel openings 141 along the first direction X.

Similarly, when along the second direction Y, within the fourth preset distance L4, at least two first vias Via1 corresponding to same-color light-emitting units 13 may be arranged according to the second symmetry rule, which may solve the color cast problem due to the overlapping of the first vias Via1 and the pixel openings 141 along the second direction Y.

When along the first direction X, within the third preset distance L3, at least two first vias Via1 corresponding to same-color light-emitting units 13 are arranged according to the first symmetry rule, and when along the second direction Y, within the fourth preset distance L4, at least two first vias Via1 corresponding to same-color light-emitting units 13 are arranged according to the second symmetry rule, it may solve the color cast problem due to the overlapping of the first vias Via1 and the pixel openings 141 along the first direction X and also solve the color cast problem due to the overlapping of the first vias Via1 and the pixel openings 141 along the second direction Y.

In various embodiments of the present disclosure, the display panel may at least include one of the following four symmetrical structures.

For the first symmetrical structure, along the first direction X, within the first preset distance L1, at least two first overlapping portions 151 corresponding to same-color light-emitting units 13 may be arranged according to the first symmetry rule; and such manner may solve the color cast problem due to the overlapping of the first overlapping portions 151 and the first electrodes 131 along the first direction X.

For the second symmetrical structure, along the second direction Y, within the second preset distance L2, at least two first overlapping portions 151 corresponding to same-color light-emitting units 13 may be arranged according to the second symmetry rule; and such manner may solve the color cast problem due to the overlapping of the first overlapping portions 151 and the first electrodes 131 along the second direction Y.

For the third symmetrical structure, along the direction perpendicular to the base substrate 11, if the first vias Via1 overlap the corresponding pixel openings 141, along the first direction X, within the third preset distance L3, at least two first vias Via1 corresponding to same-color light-emitting units 13 may be arranged according to the first symmetry rule; and such manner may solve the color cast problem due to the overlapping of the first vias Via1 and the pixel openings 141 along the first direction X.

For the fourth symmetrical structure, along the direction perpendicular to the base substrate 11, if the first vias Via1 overlap the corresponding pixel openings 141, along the second direction Y, within the fourth preset distance L4, at least two first vias Via1 corresponding to same-color light-emitting units 13 may be arranged according to the second symmetry rule; and such manner may solve the color cast problem due to the overlapping of the first vias Via1 and the pixel openings 141 along the second direction Y.

In various embodiments of the present disclosure, any combination of the above four symmetrical structures may be used.

If the first direction X is the row arrangement direction of the light-emitting units 13 in the display panel, the fourth preset distance L4 may be less than or equal to the second preset distance L2. The first direction X may be the row direction; and based on the vertical relationship, the second direction Y may be the column direction. When both the second symmetrical structure and the fourth symmetrical structure are included, since the first vias Via1 connected to the first electrodes 131 directly affect the flatness of the first electrodes, the symmetry requirement of the first vias Via1 along the column direction may be higher than the symmetry requirement of the first metal parts 15 along the column direction. Therefore, the fourth preset distance L4 may be set to be less than or equal to the second preset distance L2, such that the symmetry degree of the first vias Via1 along the column direction may not be weaker than the symmetry degree of the first metal parts 15 along the row direction, thereby better solving the display color cast problem.

Figure 6:
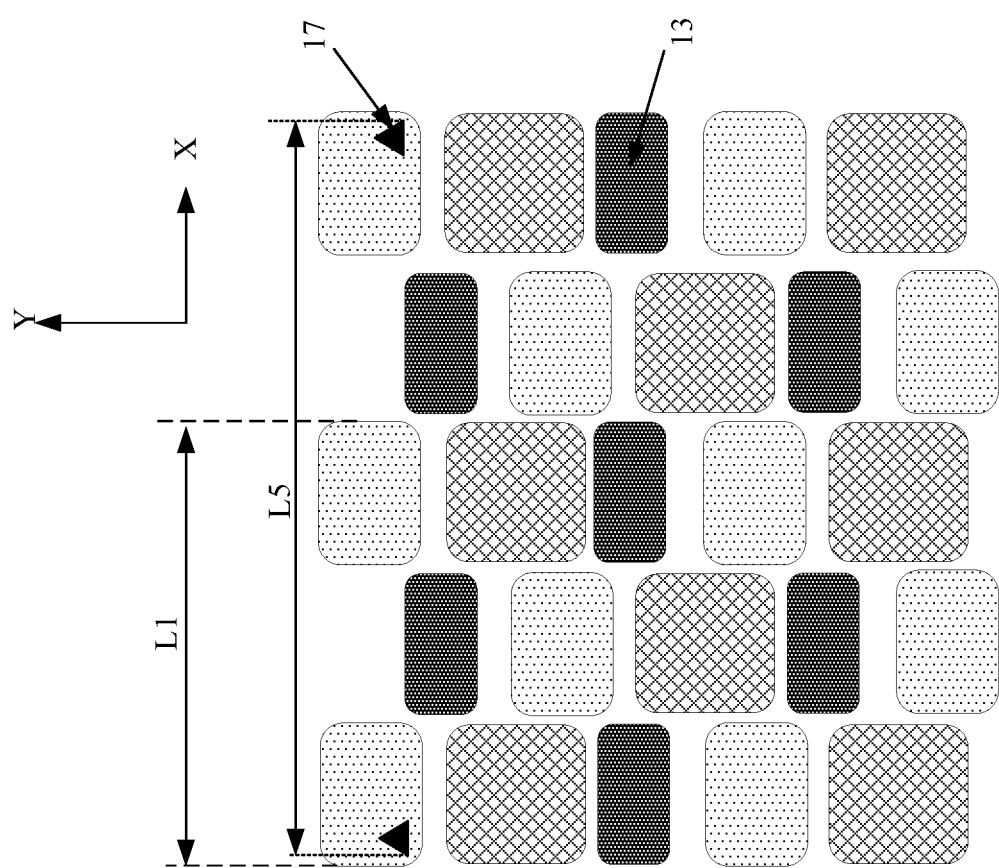
FIG. 6 illustrates another top view of light-emitting units and metal parts in a display panel according to various embodiments of the present disclosure.

As shown in FIG. 6, FIG. 6 illustrates another top view of light-emitting units and metal parts in a display panel according to various embodiments of the present disclosure. Referring to FIGS. 1, 2, 5, and 6, the array layer 12 may include a plurality of pixel circuits, the pixel circuits may correspond to the light-emitting units 13, and the pixel circuits may be used to control the light-emitting units 13 to display light-emitting; the first metal parts 15 and the pixel circuits may be electrically connected through the second metal parts, where along the direction perpendicular to the base substrate 11, the second metal parts and the pixel openings 141 may have the second overlapping portions; and along the first direction X, within the fifth preset distance L5, at least two second overlapping portions corresponding to same-color light-emitting units 13 may be arranged according to the first symmetry rule. The second metal part may be configured to include the second via Via2 that directly connects the pixel circuit with the first metal part 15. As shown in FIG. 6 in one embodiment, in order to facilitate the clear illustration, only two second metal parts may be shown, and other second metal parts, the first metal parts 15, and the first vias Via1 may not be shown. The layout of the first metal parts 15 and the first vias Via1 may refer to the description in the above-mentioned embodiments, which may not be described in detail.

In other embodiments, at least one metal layer may be included between the pixel circuit and the first metal part 15; the first metal part 15 and the metal layer may be connected through vias; and the metal layer and the pixel circuit may be connected through vias. At this point, the second metal part may include the metal, between the first metal part 15 and the pixel circuit, and the vias. In one embodiment, the first symmetry rule may include axial symmetry, and the second symmetry rule may include central symmetry.

In various embodiments of the present disclosure, along the first direction X, within the fifth preset distance L5, at least two second overlapping portions corresponding to same-color light-emitting units 13 may be arranged according to the first symmetry rule, and the color cast of the same-color light-emitting units 13 may be compensated and cancelled with each other, which may solve the color cast problem due to the irregular arrangement of the second metal parts in the same-color light-emitting units 13 along the first direction X.

Compared with the first overlapping portion 151, since the second overlapping portion has a greater distance than the first electrode 131, the second overlapping portion may have a weaker effect on the flatness of the first electrode 131. Therefore, the fifth preset distance L5 may be set to be greater than or equal to the first preset distance L1, such that the symmetry degree of the first overlap portion 151 may not be weaker than the symmetry degree of the second overlap portion, thereby better compensating the color cast.

In one embodiment of the present disclosure, as shown in FIGS. 1 and 3, two same-color light-emitting units 13 corresponding to two first overlapping portions 151 arranged according to the first symmetry rule may be two adjacent same-color light-emitting units 13 along the first direction X. In such way, along the first direction X, the display color cast of two same-color light-emitting units 13 may be compensated within a minimum distance, thereby better solving the color cast problem along the first direction X.

Figure 7:
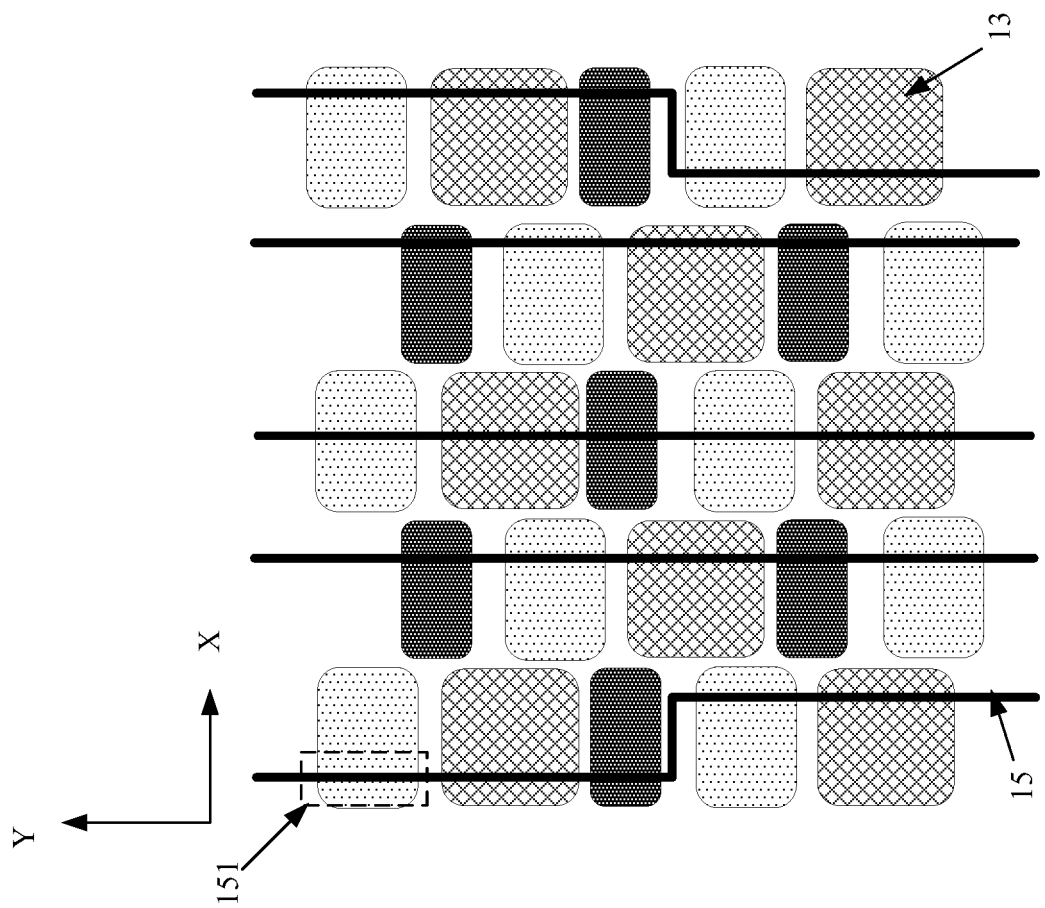
FIG. 7 illustrates another top view of light-emitting units and metal parts in a display panel according to various embodiments of the present disclosure.

In other embodiments, as shown in FIG. 7, FIG. 7 illustrates another top view of light-emitting units and metal parts in a display panel according to various embodiments of the present disclosure. In one embodiment, n other light-emitting units 13 may be between two same-color light-emitting units 13 corresponding to two first overlapping portions 151 arranged according to the first symmetry rule, and n may be a positive integer. The first overlapping portions corresponding to n other light-emitting units 13 may be designed to be an un-symmetrical layout. In FIG. 7, n=3 may be taken as an example for illustration, and n may be set based on requirements. Two adjacent same-color light-emitting units 13 are arranged according to the symmetrical manner along the first direction X. Although the compensation effect is desirable, the wiring manner may be too ideal, which may not be beneficial for the complicated wiring situation of actual products. The arrangement manner provided in one embodiment may reduce the number of the first overlapping portions 151 that need to be symmetrically arranged, which may facilitate the wiring layout of the first metal parts 15. While realizing color cast compensation to a certain degree, the wiring layout difficulty of the first metal parts 15 may be reduced; and the wiring layout of the first metal parts 15 and the effect of compensating color cast may be traded off.

Optionally, it may set n≤3. If the value of n is extremely large, the distance of the light-emitting units 13 corresponding to the first overlapping portions 151 that satisfy the first symmetry rule may be extremely large, resulting in poor color cast compensation. When n≤3, on the one hand, it may solve the problem of poor compensation effect due to the excessive distance of the light-emitting units 13 corresponding to the first overlapping portions 151 that satisfy the corresponding rule; and on the other hand, based on requirements, one, two or three other light-emitting units 13 may be configured between the light-emitting units 13 corresponding to the first overlapping portions 151 that satisfy the corresponding rule, the value of n may be selected based on the cast compensation accuracy, and appropriate wiring symmetry accuracy may be selected to trade off the wiring layout of the first metal parts 15 and the effect of compensating color cast. While facilitating the wiring layout of the first metal parts 15, it may have a better color cast compensation effect. Therefore, in various embodiments of the present disclosure, it may set n<3.

Optionally, the first preset distance L1 may be less than or equal to 200 μm. For the current common display panels, based on the design size of the light-emitting units 13, the inventor found that when the first preset distance L1 is less than or equal to 200 μm, it can have a desirable color cast compensation effect; and if the first preset distance L1 exceeds 200 μm, the color cast compensation effect may be poor. Therefore, in various embodiments of the present disclosure, the first preset distance L1 may be set to be less than or equal to 200 μm.

In various embodiments of the present disclosure, the display panel may at least include red light-emitting units R, green light-emitting units G, and blue light-emitting units B. Based on the color properties of light, the red light-emitting units R may be more likely to be affected by the flatness of the first electrodes 151 and cause color cast. Therefore, in various embodiments of the present disclosure, along the first direction X, within the first distance, at least two first overlapping portions 151 corresponding to red light-emitting units R may be arranged according to the first symmetry rule, which may better solve the color cast problem of the red light-emitting units R due to the poor flatness of the first electrodes 131.

As disclosed above, the display panel may at least include the red light-emitting units R, the green light-emitting units G, and the blue light-emitting units B. Since the area of the blue light-emitting unit B is relatively large, the pixel opening 141 may be relatively large, the area of the first overlapping portion 141 exposed by the pixel opening 141 may be relatively large, and the impact of the blue light-emitting unit B on the color cast may also be relatively large. Therefore, in various embodiments of the present disclosure, along the first direction X, within the first distance, at least two first overlapping portion 151 corresponding to blue light-emitting units B may be arranged according to the first symmetry rule, which may better solve the color cast problem of the blue light-emitting units B due to the poor flatness of the first electrodes 131.

The first direction X can be set as the row arrangement direction of the light-emitting units 13 in the display panel; the first symmetry rule may be an axial symmetry according to the first symmetry axis, and the first symmetry axis may be the symmetry axis of two same-color light-emitting units 13 corresponding to the first overlapping portions 151 symmetrically arranged along the first direction X; or the first symmetry rule may be an central symmetry according to the first symmetry center, and the first symmetry center may be the symmetry center of two same-color light-emitting units 13 corresponding to the first overlapping portions 151 symmetrically arranged along the first direction. Along the first direction X, the first overlapping portions 151 may be arranged to be axially symmetrical or centrally symmetrical, and the color cast caused by the first overlapping portions 151 corresponding to two same-color light-emitting units 13 along the first direction X may be compensated and cancelled with each other, thereby improving the display quality.

It is also possible that the second symmetry rule may be a central symmetry according to the second symmetry center, and the second symmetry center may be the symmetry center of two same-color light-emitting units 13 corresponding to the first overlapping portions 151 symmetrically arranged along the second direction Y. Along the second direction Y, the first overlapping portions may be arranged to be centrally symmetrical, and the color cast caused by the first overlapping portions 151 corresponding to two same-color light-emitting units 13 along the second direction Y may be compensated and cancelled with each other, thereby improving the display quality.

In various embodiments of the present disclosure, the first metal part 15 may be a metal layer, which may be used to fabricate a signal line with a data voltage Vdata, a signal line with a positive voltage PVDD, and a light-blocking layer of an indium gallium zinc oxide (IGZO) thin-film transistor (TFT). The usage rate of the first metal parts 15 may be high, the overlapping portions between the first metal parts 15 and the pixel openings 141 may be high, the number of the first vias Via1 on the metal layer may also be relatively large, and the first vias Via1 overlapping the pixel openings 141 on the metal layer may be relatively large. Therefore, the first overlapping portions 151 and the first vias Via1 may have relatively large impact on the flatness of the first electrode 131.

In the existing technology, the first overlapping portions 151 and the first vias Via1 may have no specific symmetrical layout, which may result in serious display color cast problem. Such display color cast problem may be due to the poor flatness of the first electrodes 131, which may result in poor flatness of the color resist layer on the light-exiting side of the light-emitting units 13 and affect the uniformity of light transmission of the color resist layer, thereby resulting in color cast. In the technical solutions of the present disclosure, the symmetrical layout solution may solve the display color cast problem due to the poor flatness of the first electrodes.

As shown in FIG. 8, FIG. 8 illustrates graphs of viewing angle and chromaticity according to various embodiments of the present disclosure. The left graph is a graph of viewing angle and chromaticity of a conventional display panel, and the right graph is a graph of viewing angle and chromaticity of the display panel in embodiments of the present disclosure. The horizontal axis is the viewing angle, the vertical axis is the chromaticity, and w, r, g, and b represent the curves of white light, red light, green light, and blue light, respectively. It can be seen from FIG. 8 that, in the existing display panel, the chromaticity curve of a same color light may have poor symmetry and large color cast. However, in various embodiments of the present disclosure, the chromaticity curve of the light of a same color may have desirable symmetry and no color cast.

In various embodiments of the present disclosure, the light-emitting unit 13 may be an OLED, the display panel may be an HTD (hybrid TFT display), and the pixel circuit may include, but may not be limited to, a 7T1C circuit. The pixel circuit may have IGZO as the active layer TFT and polysilicon as the active layer TFT.

Figure 9:
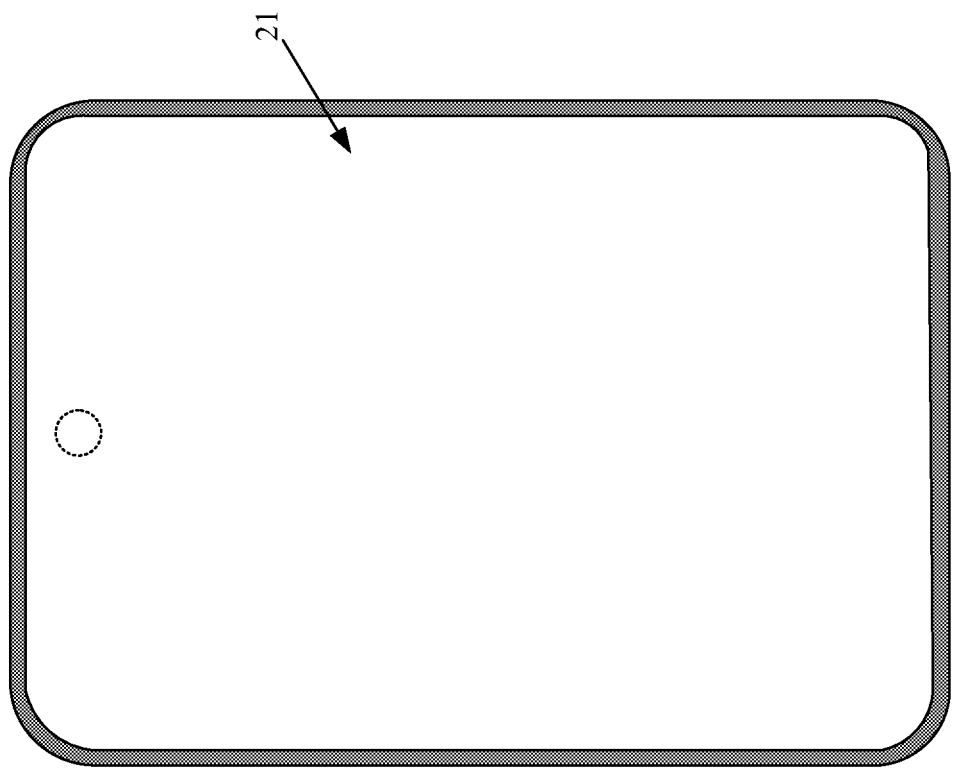
FIG. 9 illustrates a structural schematic of a display device according to various embodiments of the present disclosure.

Based on the above-mentioned embodiments, another embodiment of the present disclosure further provides a display device, as shown in FIG. 9. FIG. 9 illustrates a structural schematic of a display device according to various embodiments of the present disclosure. The display device may include a display panel 21; and the display panel 21 may be the display panel described in any of the above-mentioned embodiments of the present disclosure.

In various embodiments of the present disclosure, the display device may be a device which includes, but is not limited to, electronic devices with display function such as mobile phones, tablet computers, notebook computers, smart wearable devices, and the like. Due to the use of the display panel in the above-mentioned embodiments, the color cast problem caused by the flatness of the first electrodes may be solved through the symmetrical layout.

Various embodiments in the specification may be described in a progressive manner, or a parallel manner, or a combination of progressive and parallel manners. Each embodiment may focus on differences from other embodiments. Same and similar parts of various embodiments may refer to each other. As for the display device disclosed in various embodiments, since the display device corresponds to the display panel disclosed in various embodiment, the description may be relatively simple, and the relevant part may be referred to the description of the relevant part of the display panel.

In the description of the present disclosure, it should be understood that the terms "upper", "lower", "top", "bottom", "inner", "outer" and other indications of the orientation or positional relationship may be based on the orientation or positional relationship shown in the drawings, which may be merely for the convenience of describing the present disclosure and simplifying the description, and may not indicate or imply that the device or element referred to must have a specific orientation, be constructed and operated in a specific orientation. Therefore, above terms may not be understood as restrictions on the present disclosure. When a component is considered to be "connected" to another component, it may be directly connected to another component or may be a centrally located component at the same time.

It should also be noted that in the present disclosure, relational terms such as first, second and the like may be merely used to distinguish one entity or operation from another entity or operation and may not necessarily require or imply any such actual relationship or order between these entities or operations. Moreover, the terms "include", "include" or any other variations thereof may be intended to cover non-exclusive inclusion, so that an article or equipment including a series of elements may not only include those elements, but also include other elements not explicitly listed, or also include elements inherent to such an article or equipment. If there are no more restrictions, the element defined by the sentence "including a . . . " may not exclude the existence of other same elements in the article or equipment that includes the above elements.

The above description of the disclosed embodiments enables those skilled in the art to implement or use the present disclosure. Various modifications to these embodiments may be obvious to those skilled in the art, and the general principles defined herein may be implemented in other embodiments without departing from the spirit or scope of the present disclosure. Therefore, the present disclosure may not be limited to various embodiments shown in the present disclosure but should conform to the widest scope consistent with the principles and novel features disclosed in the present disclosure.

What is claimed is:

1. A display panel, comprising:
a base substrate;
an array layer, on a side of the base substrate;
a plurality of light-emitting units, on a side of the array layer away from the base substrate, wherein a light-emitting unit of the plurality of light-emitting units includes a first electrode, a light-emitting layer, and a second electrode which are sequentially disposed away from the base substrate;
a pixel defining layer, on the side of the array layer away from the base substrate, wherein the pixel defining layer includes a plurality of pixel openings, the plurality of pixel openings corresponds to the plurality of light-emitting units, and a projection of the light-emitting layer on the pixel defining layer is within a pixel opening; and
a first metal part, between the array layer and the first electrode, wherein:
the first metal part is electrically connected to the first electrode through a first via;
along a direction perpendicular to the base substrate, an overlapping portion of the first metal part and the pixel opening is a first overlapping portion; along a first direction, within a first preset distance, at least two first overlapping portions corresponding to same-color light-emitting units are arranged according to a first symmetry rule; and the first direction is in parallel with the base substrate,
wherein the first preset distance is a width occupied by a number of consecutive adjacent rows of light-emitting units along the first direction; and
the first symmetry rule is an axial symmetry according to a first symmetry axis;
and the first symmetry axis is a symmetry axis of two same-color light-emitting units corresponding to two first overlapping portions symmetrically arranged along the first direction; or
the first symmetry rule is a central symmetry according to a first symmetry center; and the first symmetry center is a symmetry center of two same-color light-emitting units corresponding to two first overlapping portions symmetrically arranged along the first direction.

2. The display panel according to claim 1, wherein:
along a second direction, within a second preset distance, at least two first overlapping portions corresponding to same-color light-emitting units are arranged according to a second symmetry rule; and the second direction is in parallel with the base substrate and perpendicular to the first direction, wherein the second preset distance is a length occupied by a number of consecutive adjacent rows of light-emitting units along the second direction.

3. The display panel according to claim 2, wherein:
the first direction is a row arrangement direction of the plurality of light-emitting units in the display panel, and the second preset distance is greater than or equal to the first preset distance.

4. The display panel according to claim 2, wherein:
along the direction perpendicular to the base substrate, the first via and the pixel opening are overlapped with each other; and
along the first direction, within a third preset distance, at least two first vias corresponding to same-color light-emitting units are arranged according to the first symmetry rule; and/or
along the second direction, within a fourth preset distance, at least two first vias corresponding to same-color light-emitting units are arranged according to the second symmetry rule; and the second direction is in parallel with the base substrate and perpendicular to the first direction.

5. The display panel according to claim 4, wherein:
the first direction is a row arrangement direction of the plurality of light-emitting units in the display panel, and the fourth preset distance is less than or equal to the second preset distance.

6. The display panel according to claim 2, wherein:
the first direction is a row arrangement direction of the plurality of light-emitting units in the display panel; and
the second symmetry rule is a central symmetry according to a second symmetry center; and the second symmetry center is a symmetry center of two same-color light-emitting units corresponding to two first overlapping portions symmetrically arranged along the second direction.

7. The display panel according to claim 1, wherein:
along the direction perpendicular to the base substrate, the first via and the pixel opening are not overlapped with each other.

8. The display panel according to claim 7, wherein:
along a second direction, a distance between the first via and the pixel opening is greater than 1.5 µm; and the second direction is in parallel with the base substrate and perpendicular to the first direction.

9. The display panel according to claim 1, wherein:
along the direction perpendicular to the base substrate, the first via and the pixel opening are overlapped with each other; and
along the first direction, within a third preset distance, at least two first vias corresponding to same-color light-emitting units are arranged according to the first symmetry rule.

10. The display panel according to claim 9, wherein:
the first direction is a row arrangement direction of the plurality of light-emitting units in the display panel, and the third preset distance is less than or equal to the first preset distance.

11. The display panel according to claim 1, wherein:
the array layer includes a plurality of pixel circuits, the plurality of pixel circuits corresponds to the plurality of light-emitting units, and the first metal part and a pixel circuit are electrically connected through a second metal part, wherein:
the second metal part and the pixel opening have a second overlapping portion; and along the first direction, within a fifth preset distance, at least two second overlapping portions corresponding to same-color light-emitting units are arranged according to the first symmetry rule.

12. The display panel according to claim 11, wherein:
the fifth preset distance is greater than or equal to the first preset distance.

13. The display panel according to claim 1, wherein:
two same-color light-emitting units corresponding to two first overlapping portions arranged according to the first symmetry rule are two adjacent same-color light-emitting units along the first direction.

14. The display panel according to claim 1, wherein:
a number n of other light-emitting units is between two same-color light-emitting units corresponding to two first overlapping portions arranged according to the first symmetry rule, and n is a positive integer.

15. The display panel according to claim 14, wherein n≤3.

16. The display panel according to claim 1, wherein:
the first preset distance is less than or equal to 200 µm.

17. The display panel according to claim 1, wherein:
the display panel at least includes red light-emitting units, green light-emitting units, and blue light-emitting units; and
along the first direction, within the first distance, at least two first overlapping portions corresponding to two red light-emitting units are arranged according to the first symmetry rule.

18. The display panel according to claim 1, wherein:
the display panel at least includes red light-emitting units, green light-emitting units, and blue light-emitting units; and
along the first direction, within the first distance, at least two first overlapping portions corresponding to two blue light-emitting units are arranged according to the first symmetry rule.

19. The display panel according to claim 1, wherein:
the first direction is a row arrangement direction of the plurality of light-emitting units in the display panel.

20. A display device, comprising:
a display panel, comprising:
a base substrate;
an array layer, on a side of the base substrate;
a plurality of light-emitting units, on a side of the array layer away from the base substrate, wherein a light-emitting unit of the plurality of light-emitting units includes a first electrode, a light-emitting layer, and a second electrode which are sequentially disposed away from the base substrate;
a pixel defining layer, on the side of the array layer away from the base substrate, wherein the pixel defining layer includes a plurality of pixel openings, the plurality of pixel openings corresponds to the plurality of light-emitting units, and a projection of the light-emitting layer on the pixel defining layer is within a pixel opening; and
a first metal part, between the array layer and the first electrode, wherein:
the first metal part is electrically connected to the first electrode through a first via;
along a direction perpendicular to the base substrate, an overlapping portion of the first metal part and the pixel opening is a first overlapping portion; along a first direction, within a first preset distance, at least two first overlapping portions corresponding to same-color light-emitting units are arranged according to a first symmetry rule; and the first direction is in parallel with the base substrate,
wherein the first preset distance is a width occupied by a number of consecutive adjacent rows of light-emitting units along the first direction; and
the first symmetry rule is an axial symmetry according to a first symmetry axis;
and the first symmetry axis is a symmetry axis of two same-color light-emitting units corresponding to two first overlapping portions symmetrically arranged along the first direction; or
the first symmetry rule is a central symmetry according to a first symmetry center;
and the first symmetry center is a symmetry center of two same-color light-emitting units corresponding to two first overlapping portions symmetrically arranged along the first direction.

* * * * *